United States Patent [19]

Lubarsky et al.

[11] Patent Number: 4,740,744
[45] Date of Patent: Apr. 26, 1988

[54] DIGITAL SIGNAL PROCESSING APPARATUS FOR ANALOG SIGNALS HAVING WIDE FREQUENCY AND DYNAMIC RANGES

[75] Inventors: Andre Lubarsky, Sunnyvale; Donald N. Simkins, Fremont, both of Calif.

[73] Assignee: LP COM, Mountain View, Calif.

[21] Appl. No.: 777,092

[22] Filed: Sep. 18, 1985

[51] Int. Cl.$^4$ .............................................. G01R 33/20
[52] U.S. Cl. .................................. 324/78 D; 324/79 D
[58] Field of Search ............... 324/77 R, 78 R, 78 D, 324/78 E, 78 Q, 78 Z, 77 D; 364/484, 487

[56] References Cited

U.S. PATENT DOCUMENTS

| | | | |
|---|---|---|---|
| 3,949,177 | 4/1976 | Ball et al. | 324/78 D |
| 4,253,373 | 3/1981 | Foerst | 324/79 D |
| 4,454,470 | 6/1984 | Boettner | 324/78 R |
| 4,607,217 | 8/1986 | Bhargava | 324/78 R |
| 4,609,990 | 9/1986 | Sember et al. | 324/78 R |

*Primary Examiner*—Michael J. Tokar
*Attorney, Agent, or Firm*—Limbach, Limbach & Sutton

[57] ABSTRACT

A digital signal processing apparatus for operating upon analog signals having wide dynamic and frequency ranges is described. The invention includes a digital section and an analog section, the digital section providing digital words representative of analog signals to be transmitted, and receiving digital representations of analog signal received from the test subject, and processing said digital representations. The analog section transforms the digital representations of the signals to be transmitted into analog form and applies them to the test subject by way of a balanced output driver. The analog section includes a receiving section which receives analog signals from the test subject and transforms the analog signals into digital representations thereof. The digital section also provides control information to the analog section. The data and control information being communicated between the analog and digital sections are transferred by way of optical isolators. Further, the analog section is powered by a floating power supply. As such the analog section presents an input and an output port to the test subject which are transformer-like; i.e. floating and balanced. Further disclosed is a method for frequency measurement which determines and operates upon the time interval which corresponds to the integral number of half cycles in the incoming waveform. To provide enchanced noise rejection in the frequency measurement, a nonzero threshold level is employed to validate each half cycle in the waveform. The results are then displayed in accordance with a method which permits quick response of the display to large variations in the measurements, and slower response to small variations in the measurements.

16 Claims, 5 Drawing Sheets

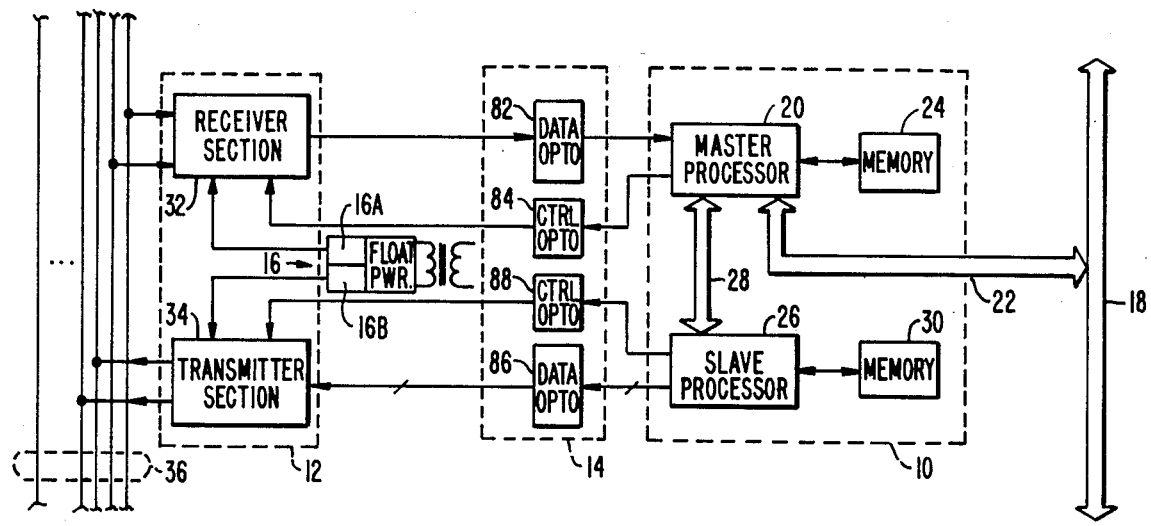
FIG._1.
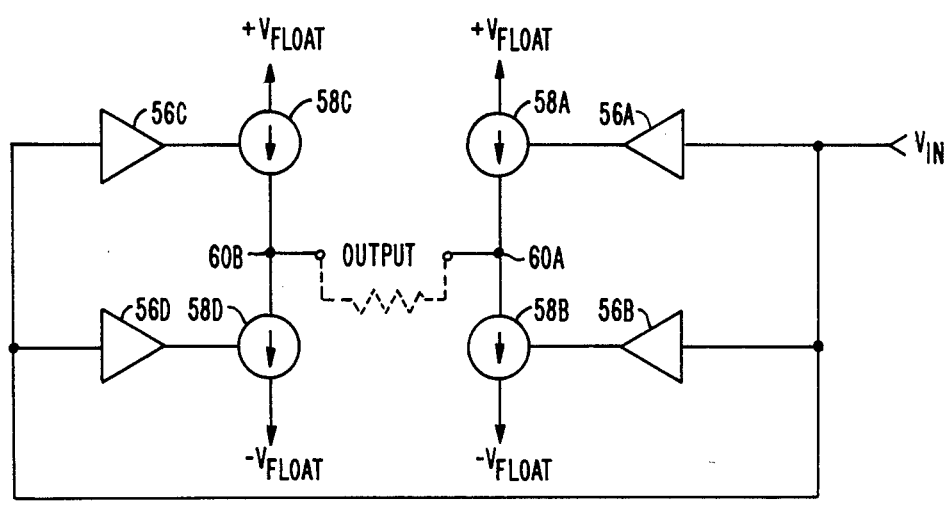
FIG._4.

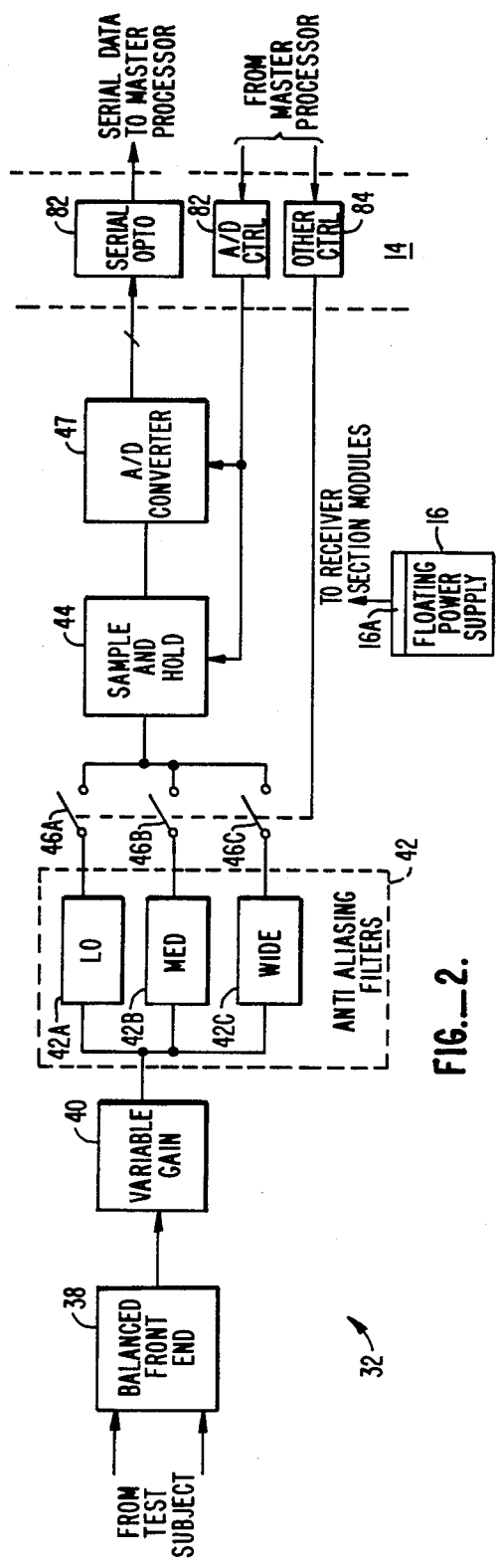
FIG._2.
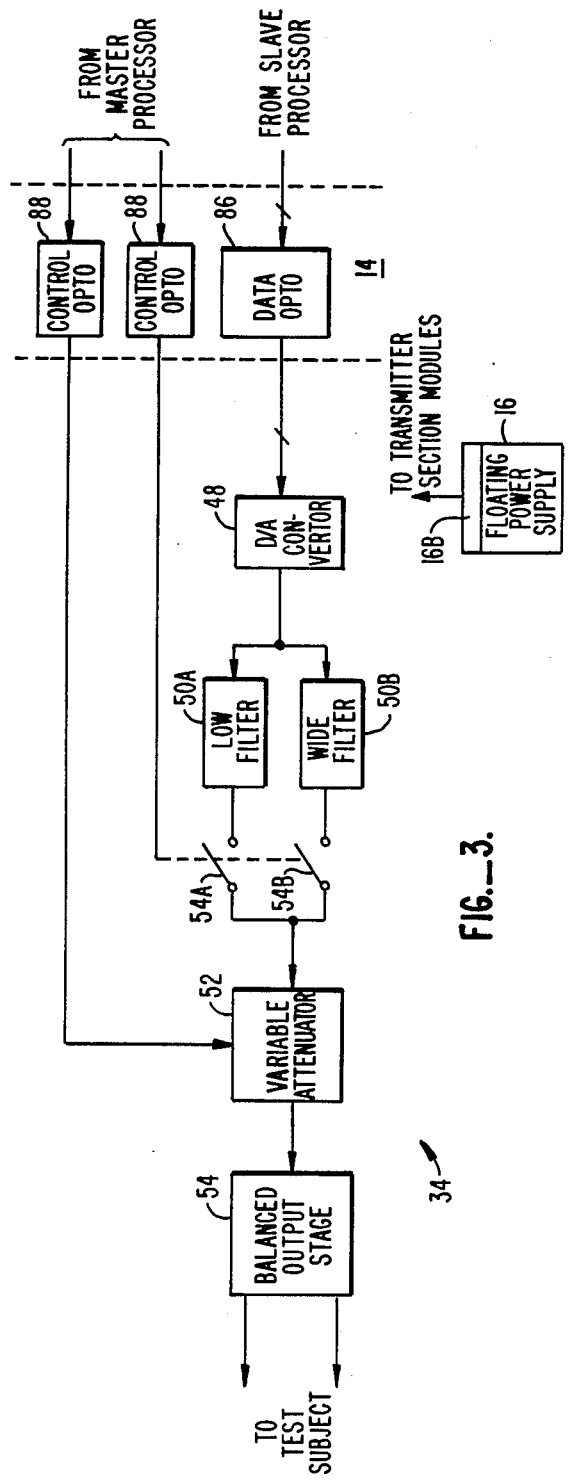
FIG._3.

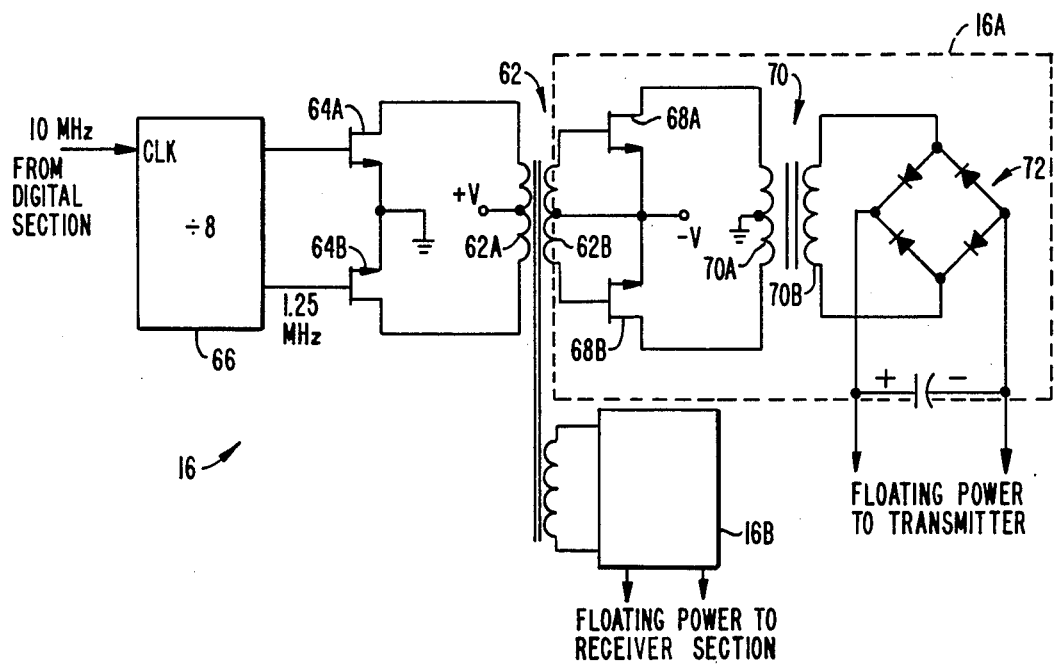
FIG._5.
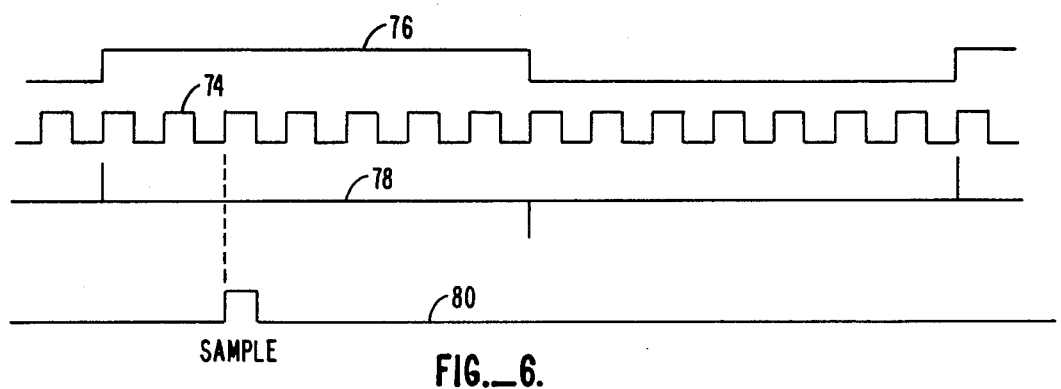
FIG._6.

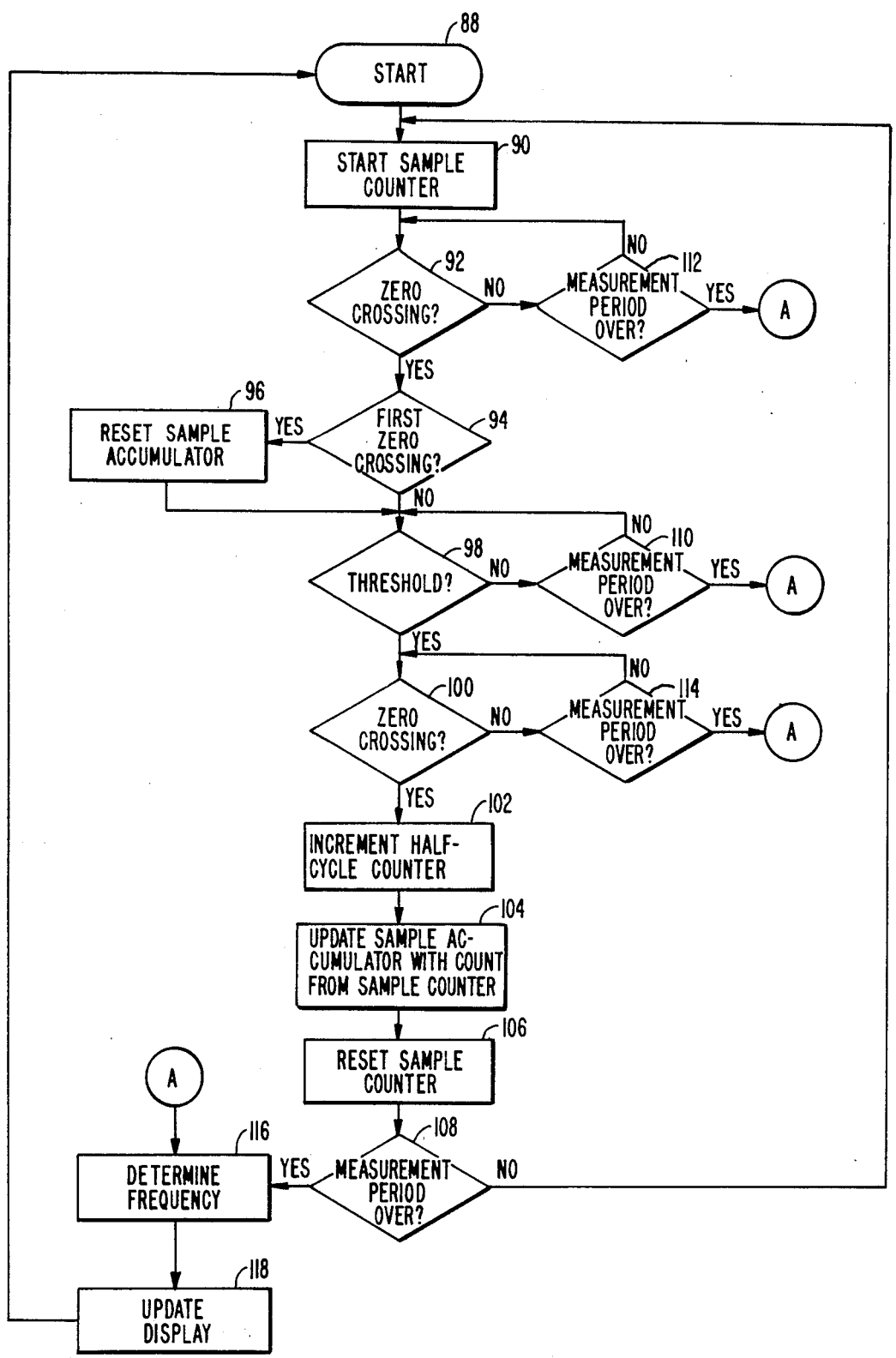
FIG._8.

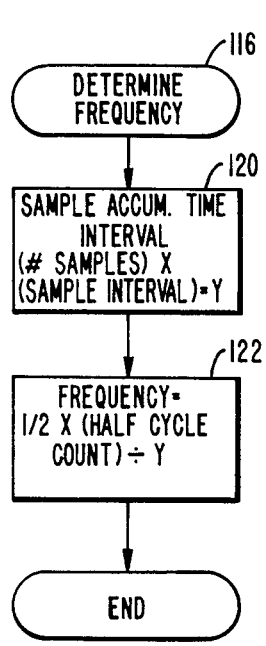
FIG._9.
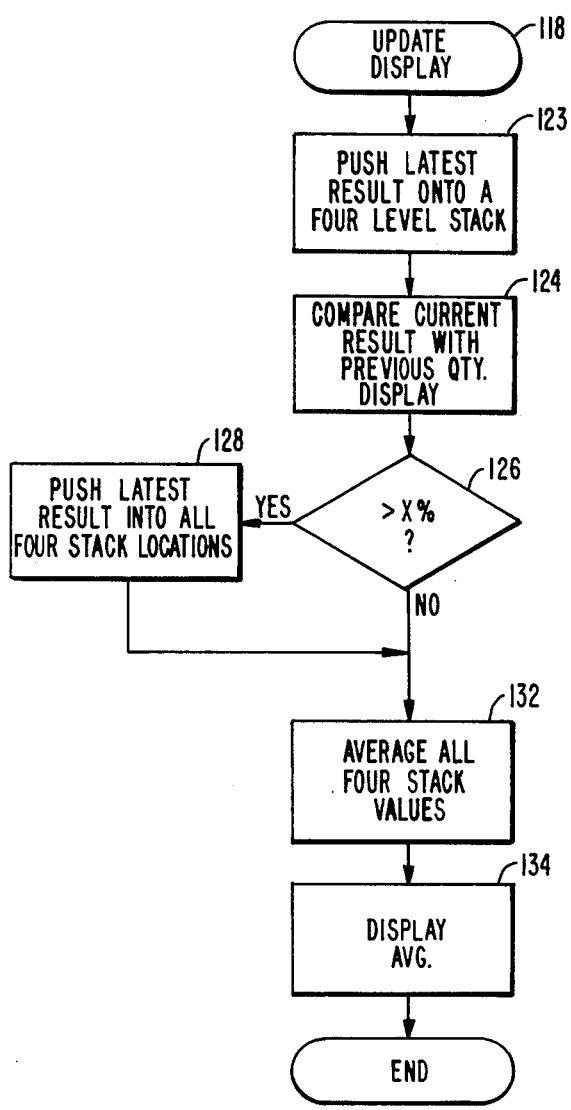
FIG._10.
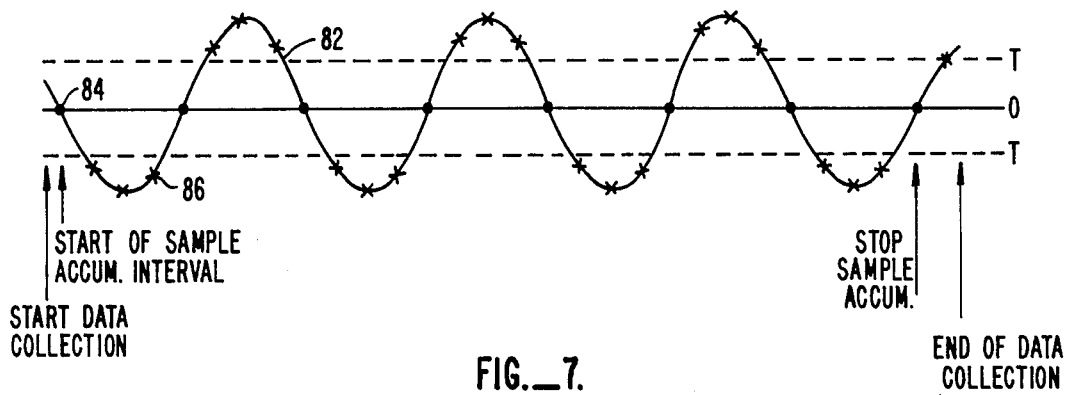
FIG._7.

DIGITAL SIGNAL PROCESSING APPARATUS FOR ANALOG SIGNALS HAVING WIDE FREQUENCY AND DYNAMIC RANGES

TECHNICAL FIELD

The present invention is directed, generally, to the digital processing of analog signals, and more particularly to a processing apparatus which operates upon analog signals having wide frequency and dynamic ranges.

BACKGROUND ART

In the test equipment area, the availability of intelligent, low-cost digital logic circuitry has permitted many test functions, normally performed in the analog domain, to be performed instead in the digital domain. While there have been numerous efforts to shift more of such processing into the digital domain, the prior art to date has failed to provide an economic and compact digital signal processing unit which is capable of handling analog signals having a wide frequency range as well as a wide dynamic range.

Typical prior art devices either suffer from a limited frequency range, such as digital voltmeters (DVM), or are unable to accomodate low level analog signals in the presence of high level digital signals.

It is particularly important in certain applications to provide digital signal processing apparatus which can be isolated from the test subject matter as well as from the apparatus power source and result analyzing circuitry.

Further, where low level signals are being processed or provided to a circuit under test, it is a difficult task to maintain the quality of such low level signals and to also perform high speed digital processing in close proximity thereto.

There is an inherent difference in handling analog signals versus digitial signals. While each approach has advantages over the other, the techniques which provide such advantages in one approach do not easily coexist in the same environment with the techniques of the other. For example, in the analog area much effort is placed in maintaining a good signal to noise ratio and wide bandwidth as the signal is being handled.

In contrast, once a signal is digitized, bandwidth and signal to noise ratios are not a problem. In digital signal processing it is important to have a sufficient number of samples of a particular signal such that the particular signal can be reconstructed from the finite number of samples obtained. This often requires the use of high speed processing logic operating at signal levels much higher than the levels of the analog signals being processed. From the standpoint of a systems designer, the coexistence of low level, high frequency analog and high speed digital processing circuitry on the same board present difficult design problems.

A further difficulty with previous digital signal processing apparatus, specifically frequency measuring apparatus, is that the measurement methods employed often resulted in unacceptable error. More often than not, the frequency measured was substantially on the high side of the true frequency of the signal being measured. Often, such error was due to the inability of the apparatus to reject noise present on the waveform to be measured.

SUMMARY OF THE INVENTION

These and other problems of prior attempts at a digital signal processing unit which is operative on analog signals having wide frequency and dynamic ranges are overcome by the present invention of an apparatus comprising an analog section which receives the analog signals at a balanced input port and provides digital representations of said analog signals, and which receive digital representations of analog signals to be transmitted, and generates such analog signals from the digital representations thereof and provides such analog signals at a balanced output port; a digital section for processing the digital representations of the received analog signal and for providing to the analog section the digital representations of the analog signals to be transmitted, and for providing control signals to the analog section, optical isolation means for communicating the digital representations and control signals between the digital section and the analog section, and power supply means, floating with respect to the digital section, for providing power to the analog sections.

Preferably, the analog sections include a receiver section and a transmitter section. A separate floating power supply section is used to supply power to transmitter section and to the receiver station. In this manner, the receiver section can be floated with respect to the transmitter section and they both can be floating relative to the digital power.

In a preferred embodiment of the present invention, the floating power supply means derives its power from a signal which is synchronized to the clock frequency of the digital section at a very high frequency in order to reduce input-to-digital circuitry capacity such that any noise or other interference in the analog section associated with the edges of the waveforms in the digital section are predictable and can be dealt with.

Also in a preferred embodiment of the present invention, the optical isolation means include high speed optical isolation means for communicating data between the analog and digital sections, and lower speed optical isolation means for communicating control signals between the digital and analog sections.

Further, a unique driver stage is utilized in the analog output section which employs a plurality sources driven in phased relation to achieve an output characteristic which appears, to the test subject, to be a transformer winding.

As a part of the signal analysis performed by the digital section of the present invention, a method of counting the frequency of an incoming signal is provided. In the preferred embodiment of the present invention, this method includes the measurement of the time period between an integral number of half cycles in the incoming waveform and discarding the fractional parts of the waveform at the beginning and end of the measurement interval. In a further embodiment, a threshold, greater than zero, is utilized to determine whether a half cycle should be counted. Further, an averaging method is utilized in displaying the results of the frequency being measured so that the displayed result changes instantly for large changes in the frequency of the incoming waveform and very slowly for small changes in the frequency of the waveform.

It is therefore an object of the present invention to provide a digital signal processing apparatus which is capable of processing analog signals having wide dynamic and frequency ranges.

It is another object of the present invention to provide an apparatus for receiving and transmitting analog signals having wide frequency and dynamic ranges and for digitally synthesizing the transmitted signals, and for analyzing the received analog signals by way of digital signal processing.

It is a further object of the present invention to provide digital signal processing test apparatus including an analog section and a digital section, which analog section is isolated from the digital section by way of optical couplers, for transmitting data and control information between the analog and digital sections, and a floating, synchronized, high frequency power supply for supplying power to the analog section.

It is a still further object of the present invention to provide a digital signal processing apparatus which is adapted for operating upon analog signals having wide dynamic and frequency ranges, which apparatus appears to the subject under test to be a transformer winding.

It is therefore an object of the present invention to provide frequency measurement method which operates upon the time interval corresponding to an integral number of half cycles within the waveform to be measured.

It is another object of the present invention to provide a method of frequency measurement which employs thresholds, greater than zero, which counts the number of half cycles within the waveform and which utilizes the threshold to validate each half cycle being counted.

These and other objectives features and advantages of the present invention will be more readily understood upon consideration of the following detailed description of certain embodiments of the invention and accompanying drawings.

BRIEF DESCRIPTION OF THE DRAWINGS

FIG. 1 is a simplified block diagram of the present invention.

FIG. 2 is a simplified functional block diagram of the receiver section of the analog section of the present invention.

FIG. 3 is a simplified functional block diagram of the transmitter section of the analog section of the present invention.

FIG. 4 is a simplified block diagram of the output driver of the transmitter section of the present invention.

FIG. 5 is a simplified schematic of the floating power supply of the present invention.

FIG. 6 illustrates the relationship among the clock waveform of the digital section of the present invention, the primary power source of the floating power supply, and the sampling timing of the analog section.

FIG. 7 is a graph illustrating the frequency measuring method of the present invention.

FIG. 8 is a flow diagram of the frequency measuring method of the present invention.

FIG. 9 is a more detailed flow diagram of the frequency determination step of the present invention.

FIG. 10 is a flow diagram of the output display method of the present invention.

DETAILED DESCRIPTION OF THE INVENTION

Referring to FIG. 1, the architecture of the present invention is illustrated in simplified form. Reference is made to the co-pending application entitled Multi-function Test Apparatus, Ser. No. 777,173 filed even date herewith, and assigned to a common assignee. The above referenced co-pending application is incorporated by reference herein.

By way of background, the present invention is especially suited for incorporation into the test system architecture described in the above referenced co-pending patent application. As shown in FIG. 1, the present invention includes a digital section 10, an analog section 12, an optical isolator section 14 which couples information between the digital and analog sections, and a floating power supply 16, including isolated output sections 16A and 16B which provides isolated power to the analog section 12.

The digital section 10 communicates with a digital bus 18. In the above referenced co-pending application, a plurality of other modules share the digital bus 18, including a signalling board, an interface board, and a general purpose processor. In the operation of such a system, the processing tasks required for a particular test function are distributed among the modules connected to the digital bus 18. For example, in a test which requires the generation of a particular analog signal, and the monitoring and analysis of the response of the test subject to that test signal, the general purpose processing unit can transfer instructions to the present invention by way of digital bus 18 for the generation of the analog signal, and the receipt and analysis of the response thereto, can transmit instructions to the interface board regarding the routing of the transmitted and received signal from and to the present invention and the test subject, and in turn, assist the present invention in performing certain operations which form a part of the analysis on the received signal.

Thus, the digital section of the present invention can include processing circuitry which is capable of generating digital information which can be used to synthesize analog signals, and which can receive digital information representative of analog signals and perform digital singal analysis thereon.

In FIG. 1, the preferred embodiment of the digtial section 10 of the present invention is shown in simplified block diagram form. There, master processor 20 communicates with modules on the digital bus 18 by way of bus 22. Master processer 20 operates in conjunction with memory 24. Memory 24 can include random access memory as well as ROM type memory. In the preferred embodiment of the present invention the ROM memory can be E$^2$PROM type memory.

A slave processor 26 communicates with master processor 20 by way of bus 28. Slave processor 26 utilizes memory 30. As with memory 24, memory 30 can include random acces memory as well as ROM type memory, including E$^2$PROM types. In addition to synthesizing signals, the slave processor 26 assists the master processor 20 in other DSP computations.

Referring to the left hand side of FIG. 1, the analog section 12 includes a receiver section 32 and a transmitter section 34. Receiver section 32 receives the analog signal from the test subject while the transmitter section provides an analog signal to the test subject. In the system of the above referenced co-pending patent application, these analog signals are provided to and received from the test subject by way of analog bus 36.

The receiver section 32 provides digitized information to master processor 20 by way of optical isolator section 14. Control signals are received by receiver section 32 from master processor 20, also by way of optical isolator section 14.

Transmitter section 34 generates an analog signal by converting digital signals from slave processor 26, received by way of optical isolator section 14, and in response to control signals received from master processor 20 by way of optical isolator section 14.

Floating power supply 16 provides isolated power to both the receiver section 32 and the transmitter section 34 independently. The primary power to floating power supply 16 is derived from the primary power to the digital section 10 and is synchronized to the operation of digital section 10.

Optical isolator section 14 provides isolation between digital section 10 and analog section 12.

Referring to FIG. 2, receiver section 32, in the preferred embodiment of the present invention, includes a balanced operation amplifier front end 38. Front end 38 can be of convention design, such as the balanced instrumentation amplifiers manufactured by PMI, Santa Clara, Calif. The balanced nature of front end and the floatability of same 38 operates to provide a load to the test subject which appears to be a transformer.

The output of front end 38 is applied to a variable gain block 40. In the preferred embodiment of the present invention, variable gain block 40 provides gains or attentuation over a range of 80dB. The selection of the particular gain or attenuation used is controlled by way of control signals supplied from master processor 20 via optical isolator section 14. Variable gain block 40 operates to provide an output signal of a predetermined magnitude. Thus, when the test subject provides very low level signals for processing, such signals are received by front end 38 and amplified by variable gain block 40. In turn, when the signals from the test subject are large, variable gain block 40 provides an appropriate amount of attenuation so that the signal supplied to the downstream circuitry is of a suitable level which can be handled by such processing circuitry.

The output of variable gain block 40 is applied to anti-aliasing filters 42. In the preferred embodiment of the present invention, three filter bandwidths are provided: (1) low bandwidth 42A, (2) medium bandwidth 42B, and bandwidth 42C. The outputs of each of these filters is controllably switched to the input of sample and hold block 44. Switches 46A, 46B, and 46C connect the outputs of filters 42A, 42B, and 42C, respectively, to sample and hold block 44. The state of switches 46A, 46B, and 46C are controlled by way of control signals supplied from master processor 20 by way of optical isolation block 14.

Sample and hold block 44 provides a signal which is converted into digital form by analog to digital converter 47. Analog to digital converter block 47 and sample and hold block 44 operate at a rate controlled by control signals supplied from master processor 20 through optical isolator block 14. Finally, the output of analog to digital converter 47 is supplied to master processor 20 by way of optical isolator block 14.

Referring to FIG. 3, the transmitter section receives digital data from slave processor 26 by way of optical isolator section 14 and digital to analog converter block 48. Digital to analog converter block 48 supplies the converted signal to filter block 50. Filter block 50 includes a low bandwidth filter 50A and a wide bandwidth filter 50B. The outputs of each of the filters can be connected to a variable attenuator block 52 by switches 54A and 54B. The states of these switches are controlled by way of instructions received from master processor 20 via optical isolator section 14. Filter block 50 is used to remove the high frequency signals which remain after the digital information from the slave processor 26 is processed by digital to analog converter 48. When low frequency signals are being synthesized, switch 54A will be closed and switch 54B will be open. Conversely, when higher frequency signals are being synthesized, switch 54B will be closed and switch 54A will be open.

The filtered signals from filter block 54 are received by variable attenuator block 52 which permits the adjustment of the amplitude of the signal which is to be applied to the test subject. The amount of attenuation provided is controlled by control signals received via optical isolator section 14 from master processor 20.

The output of variable attenuator block 52 is applied to a balanced output stage 54. In turn, the output from balanced output stage 54 is applied to the test subject by way of analog bus 36.

Referring now to FIG. 4, the balanced output stage 54 will be described in greater detail. As alluded to above, the balanced output stage 54 of the present invention and the floatability of the transmit output stage provides a signal to the test subject which appears much like a transformer winding. That is, the output or driver section appears to the test subject to be floating and to be capable of sourcing a signal from either of its terminals even if the other terminal is grounded.

The balanced output stage 54 includes a plurality of current sources which are driven in a phased relationship. The signal supplied from variable attenuator 52 is single ended. This signal is supplied to operational amplifiers 56A, 56B, 56C, and 56D. In turn, each of the amplifiers controls a current source 58A, 58B, 58C, and 58D. The current sink terminal of current source 58A is connected to the positive side of floating power supply output section 16B, while the current source side of current source 58B is connected to the negative side of floating power supply output section 16B. As used herein, the term "current source side" means the terminal of a current source out of which current flows, and the term "current sink side" means the terminal of a current source into which current flows.

In a similar manner, the current source terminal of current source 58C is connected to the positive side of floating power supply output section 16B while the current sink side of current source 58D is connected to the negative side of floating power supply output section 16B.

The current source side of current source 58A is connected to the current sink side of current source 58B. Similarly, the current source side of current source 58C is connected to the current sink side of current source 58D.

The signal which is supplied to the test subject is that which is present between nodes 60A and 60B; i.e. the junction between current source 58A and 58B, and the junction between current source 58C and 58D, respectively.

Operational amplifiers 56A, 56B, 56C, and 56D are supplied with the signal from variable attenuator block 52 such that operational amplifiers 56A and 56D are on when operational amplifiers 56C and 56B are off, and vice versa. In this relationship, one of the current sources which is on acts as a current source to the test subject, while the other of the current sources acts as a current sink to the test subject. The current sources and operational amplifiers are conventional. For example, the current sources 58A through 58D can be provided by the circuitry described in "Linear Applications Handbook," National Semiconductor Corporation, 1983, AN20-6. Operational amplifiers 56A through 56D can be device types LM81 manufactured by Motorola, Inc. of Phoenix, Ariz.

Referring now to FIG. 5, the floating power supply 16 and output sections 16A and 16B will now be described in greater detail. Generally, the floating power supply 16 should provide isolated power which power is devoid of transients and other noise; or if noise is present, such noise is synchronized to the digital processing frequencies.

As discussed earlier, in the preferred embodiment, the power supplied to the receiver section 32 is isolated not only from that of the digital section 10, but also from the analog section 34 and vice versa. Thus in floating power supply 16, an output section 16A is provided, which floats with respect to output section 16B. Output section 16A provides floating power to the receiver section 32 and output section 16B supplies power to the transmitter section 34.

The two sections 16A and 16B operate in a similar manner. Thus, only output section 16A will be described in detail. In the preferred embodiment of the present invention, the floating power supply includes chopper stages. More specifically, in the output stage 16A, the primary winding 62A of transformer 62 has a center tap which is coupled to the supply voltage for the digital section 10. Each end of primary winding 62A is alternatively switched to ground by way of switching transistors 64A and 64B. These switching transistors are driven by the outputs of a divide-by-eight counter 66. Divide-by-eight counter 66 is clocked by the clock signal from the digital section 10. In the preferred embodiment of the present invention, the system clock operates at 10 MHz such that the switching transistors 64A and 64B are driven at a 1.25 MHz rate. It is to be understood that the specific clock frequencies and the ratio between the switching frequency and the system clock frequency described above is only one of a wide range of clock frequencies which can be used with satisfactory results in the present invention. It is the synchronization of the switching of transistors 64A and 64B to the system clock frequency which permits any transients in the floating voltage supply to be predictable and therefore easily eliminated or accounted for.

The secondary winding 62B of transformer 62 is in turn connected to drive switching transistors 68A and 68B. In turn, these transistors are coupled to the primary winding 70A of transformer 70. Primary winding 70A has a center tap which is connected to the system ground, while the secondary 62B of transformer 62 has a center tap which connects to the junction between transistors 68A and 68B. In this manner, transistors 68A and 68B switch the terminals of primary winding 70A alternately to a negative voltage. Where the voltage supplied to primary winding 62A is +5 volts, the terminals of primary winding 70A will be switched alternatively to −12 volts.

Finally, the secondary winding 70B of transformer 70 operates into a full wave rectifier circuit 72 which supplies the floating power to the receiver section 32 of the present invention. In a similar manner circuitry in output section 16B supplies floating power to the transmitter section 34.

As discussed above, one advantage of synchronizing the floating power supply 16 to the clock frequency of the digital section 10, is that any switching transients in the floating power supply voltage will be predictable and therefore correctable. Thus, in the receiver section 32, analog to digital converter 47 and sample and hold circuit 44 can be instructed to operate at a point which is well removed in time from the point of any switching transients found in the floating power supply voltage. For example, FIG. 6 includes waveform 74 which represents the system clock, waveform 76 which represents the switching frequency of floating power supply 16, waveform 78 which represents the switching transients found in the floating power supply voltage, and the sample control signal 80 which can be supplied by master processor 20 to analog to digital converter 47 and sample and hold block 44. As can be seen from the figure, the master processor 20 can delay the issuance of the sample control signal a number of clock pulses in time from the point at which a switching transient in floating power supply 16 will occur. In this manner, the conversion of the analog signal into digital form can be assured to be free of any transient effects from the signals flowing in the floating power supply 16.

A further reason for utilizing a floating power supply which derives its primary power from a high frequency signal is that with such a configuration, the amount of isolation between the input and output of the power supply can be greatly enhanced. In previous attempts to obtain good isolation between a testing unit and its power source, such as in digital volt meters, isolation transformers were utilized which operated at a 60 Hz frequency. While direct current type isolation is clearly available with such transformers, these transformers typically do not provide good high frequency isolation. This is because of the large capacitive coupling between the primary and secondary windings of such a transformer. Typically these transformers require a large number of windings and hence provided a high degree of alternating current type coupling between the primary and secondary windings. Thus, if high frequency noise was present on the primary side of the transformer, this noise was easily coupled across to the secondary side.

In contrast, the use of a high frequency signal as a primary power source to the floating power supply permits a significant reduction in the capacitive coupling across the primary and secondary windings such that only the switching frequency and no other frequencies are passed across the transformer. In other words, with a high frequency power source the number of windings required to couple the power across the transformer can be kept small. In turn, the capacitive coupling between the primary and secondary windings can also be kept small. As such a wide range of frequencies can be prevented from crossing between the primary and secondary windings. In the above manner, the present invention provides a greater amount of isolation between its analog section and its digital section than has been possible in other prior attempts at a digital signal processing apparatus.

In the preferred embodiment of the present invention, optical isolator section 14 transfers information between the analog and digital sections in both serial and parallel form, and with both slow and fast response type optical links. For example, as can be seen from FIGS. 1 and 2, the data which is passed between the receiver section 32 and the digital section 10, as well as the control signals passed from master processor 20 and analog to digital converter block 47 and sample and hold block 44, are handled by serial, high speed, optical data couplers 82. These couplers can be fast device types listed in "Optoelectronics Designer's Catalog 1985," High Speed Opto Section, manufactured by Hewlett-Packard of Palo Alto, Calif. The control information transferred between digital section 10 and receiver section 32 are handled by optical data coupler 84. In the preferred embodiment of the present invention, optical data coupler 84 is relatively slow, such as device types listed in "Optoelectronics Catalog 1982", manufactured by Litronix, a Siemens company, of Cupertino, Calif.

Referring to FIGS. 1 and 3, the data passed between slave processor 26 and digital to analog converter 48 is transferred in parallel by optical data coupler 86, which can be device type manufactured by Hewlett-Packard of Palo Alto, Calif.

Finally, the control signals to switches 54A and 54B and to variable attenuator 52 are passed from master processor 20 to the transmitter section 34, in parallel, by way of optical couplers 88, which can be device types manufactured by Litronix, a Siemens company, of Cupertino, Calif. and listed in their publication entitled "Optoelectronics Catalog 1982".

In operation, master processor 20 receives instructions from the general purpose processor on digital bus 18. These instructions can include the generation of a signal to be applied to the test subject, and/or, instructions which can initiate the sampling and analysis of a signal from the test subject. For example, the general purpose processor can supply instructions to the master processor 20 of FIG. 1 to generate a sinewave of a particular frequency and then to measure the response of the test subject at a later point in time using a frequency analysis. These instructions are stored in random access memory 24 by master processor 20. Master processor 20 then executes the instructions, invoking the assistance of slave processor 26 in the synthesis of the sinewave, and from time to time requesting the assistance of the general purpose processor for analysis of information that it receives from the receiver section 32 of the analog section 12. Master processor 20 provides instructions to the variable attenuator 52 so as to set the level of the signal which is being supplied to the test subject, and to switches 54A and 54B in accordance with the frequency of the signal being generated. Slave processor 26 then generates the digital representation of the signal which is then supplied to the transmitter section 34 for conversion into analog form and transmission to the test subject.

Master processor 20 also supplies instructions to receiver section 32 to set the gain level of variable gain block 40 and to select the states of switches 46A, 46B, and 46C to invoke any anti-aliasing filtering that might be required. Also, master processor 20 supplies control signals to sample and hold block 44 and analog to digital converter block 46 to sample the signal being received from the test subject at a rate which is determined by the instructions stored in memory 24.

The data received by master processor 20 from receiver section 32 via optical isolator section 14 is then processed, in this case in accordance with a specific DSP algorithm. From time to time, the digital processing performed by the master processor 20 requires arithmetic and other processing operations. Master processor 20 can communicate with the general purpose processor on digital bus 18, or with slave processor 26, or some of the other modules in the bus, to request assistance in performing its processing tasks. For example, the general purpose processor can assist the master processor in the calculation of logarithmic values in the conversion of voltage levels into decibel values.

In the above manner, instructions provided by the general purpose processor to the the circuitry of FIG. 1 cause the circuitry to generate and apply signals to the test subject, to receive and analyze signals from the test subject, and to employ the services of other processors which share digital bus 18 in the performace of its processing tasks.

The circuitry of the present invention permits both analog and digital to coexist on the same board. The use of optical isolators for transferring digital signals between the analog and digital sections and the use of a floating power supply for the analog section assist in the coexistence of the analog and digital signals of very wide dynamic range on the same board.

As discussed briefly above, the digital section 10 of the present invention performs a number of digital signal processing functions. Among these is frequency counting. The present invention provides a unique method for counting frequency which does not suffer from the problems of previous counting methods, including those employed in prior digital signal processing apparatus, as well as frequency counters.

Generally, the method of the present invention operates upon a time interval which corresponds to an integer number of half cycles of the incoming waveform, and discards any fractional parts of the waveform at the beginning or end thereof. For further accuracy, the method utilizes a threshold, greater than zero, which must be exceeded by the waveform during a half cycle for that half cycle to be used as a part of the measurement.

In accordance with the method of the present invention, samples of the incoming waveform are taken at some high multiple of the highest frequency that the incoming wave form is expected to attain. In the preferred embodiment of the present invention, for the voice band which has an upper frequency limit of five KHz, the sampling frequency is selected to be approximately 25 times greater than the frequency limit; i.e., approximately 125 KHz. It is to be understood that other sampling rates can be used so long as the sampling rate is some multiple, greater than two, of the highest frequency expected to be attained by the signal being measured.

As as part of the method, a comparison is made of the magnitude of the incoming samples to determine first of all whether a sample has changed polarity, and second of all whether the sample exceeds either a positive or negative threshold limit. Once two zero crossings have been detected with a threshold crossing in between, a half cycle is registered as having occurred.

A measurement interval is alloted for taking the measurement. The number of half cycles which occur during that measurement interval is then utilized in the frequency determination. In addition to the half cycle count, the number of sample intervals which occur during each half cycle is kept track of. Whenever a valid half cycle is registered, the number of sample intervals which occurred during that half cycle is accumulated with the number of samples taken during previously validated half cycles during the measurement interval. At the end of the measurement interval the number of samples which have been accumulated are used to determine the elapsed time corresponding to the valid half cycles which have been counted. This determination can be made with knowledge of the sampling interval, as determined by the sampling rate, multiplied by the number of samples. Finally, the frequency is determined by dividing the number of half cycles by the time interval corresponding to those half cycles and multiplying by one half.

By calculating the frequency based upon an integral number of half cycles, the error which is often present in prior art counting methods and apparatus due to counting the fractional parts of a cycle, can be eliminated. Instead, if the present method is subject to any error, such error is constant whatever the frequency being counted.

The method of the present invention permits the quantity displayed to change instantaneously with large variations in the quantity measured, and to vary slowly with small changes in the quantity being measured. This is achieved by comparing the current result with the previous quantity displayed. If the difference between the two is greater than a certain percentage, or fixed threshold, such as 10 Hz, the current result is displayed. If the current result differs by less than the threshold amount, it is averaged with the last three results. The average is then displayed. If, following the display of the current result, the next result obtained differs by less than the threshold amount, an average is taken of the present result and three times the just previous result. In this manner, the quantity being displayed can follow large variations in measured frequency almost instantaneously, while for small variations in frequency, the display varies more slowly. It is to be understood that the choice of averaging of four samples, as discussed above, is not mandatory for the satisfactory practice of the method of the present invention. It is to be understood that a different number of samples can be averaged with satisfactory results.

In comparison of the frequency measurement and display method of the present invention with the performance of existing frequency measuring apparatus, it has been found that the error in measurement of a one KHz signal at a 15 dB signal to noise to ratio could be as high as approximately 50 Hz for the existing measurement apparatus. In contrast, there was no error when the measurement was obtained using the method of the present invention.

Referring to FIG. 7, a sinewave 82 is shown. This sinewave 82 represents an incoming signal as received by the receiver section 32 of the present invention. The receiver section 32 samples the sinewave at points indicated by the zeros 84 and x's 86 shown on waveform 82. It is to be understood that due to the manner in which the figure was drawn samples are coincidentally taken at the zero crossings of the waveform. In practice, the sample can occur at any point along the waveform but at a fixed interval from sample to sample. The thresholds utilized in accordance with the present invention are indicated by the dashed lines labeled T. Note that both a positive and a negative threshold is provided.

Referring to FIGS. 8, 9 and 10, the frequency measurement method of the present invention will now be described in greater detail. In FIG. 8, at the start step 88 of the method, the counters used in the method are initialized: The sample counter, the sample accumulator and the half cycle counter. At step 90, the sample counter is incremented each time a sample of the waveform 82 is taken. In step 92, it is determined whether or not a zero crossing has occurred. To do this, the polarity of consecutive samples is compared. When a change in polarity occurs, then a zero crossing is deemed to have occurred. The method remains in step 92 until a zero crossing has been detected. Thereafter, step 94 is entered in which it is determined whether or not the zero crossing is the first zero crossing of the measurement interval. If so, the sample accumulator is reset in step 96. If not, a determination is made as to whether a threshold has been exceeded, see step 98.

The threshold is some non-zero level which is used to reject low level noise perturbations in the incoming signal. For example, if in addition to sinewave 82, a higher frequency noise component is found on the waveform, the waveform will vary in accordance with that noise frequency about the zero crossing when the amplitude of sine 82 crosses zero. As such this gives rise to false zero crossings which lead to erroneous frequency measurements, typically on the high side. By setting a threshold level which is required to be exceeded during a half cycle, these errors due to the high frequency noise can be avoided. It is to be understood that the positive threshold will be used when a zero crossing from negative to positive has just previously occurred, and that a negative threshold will be utilized when a transition from positive to negative has just previously occurred.

If the threshold has been exceeded in step 98 then step 100 is entered to look for the next zero crossing. When the zero crossing occurs, step 102 is taken which causes the half cycle counter to be incremented. This is followed by step 104 which causes the sample accumulator to be updated with the count from the sample counter. The sample counter is then reset in step 106. Then, in step 108 a check is made as to whether the measurement period is over. If not, the method returns to step 90 to continue the sample count and the half cycle detection.

If, in step 98, a threshold was not exceeded, the method loops through step 110, to determine whether the measurement period is over and back to step 98, until a threshold is detected. Thereafter, step 100 is entered into to wait for the next zero crossing. Thereafter, the half cycle counter, the sample accumulator and the sample counter are operated upon as described earlier.

In step 92, if no zero crossing is detected, step 112 is looped through back to step 92. This similarly occurs when no zero crossing has been detected in step 100; i.e., the method loops step 114. Steps 108, 110, 112 and 114 permit the termination of the sample taking upon the expiration of the measurement interval. If, in any of these steps, the measurement period is determined to have expired, step 116 is executed in which a determination of the frequency is made based upon the quantity present in the half cycle counter, the quantity present in the sample accumulator and the duration of the sampling interval. Upon determination of the frequency, the result is then displayed in step 118. Thereafter, step 88, the start step, is executed.

Referring to FIG. 9, step 116 will now be described in greater detail. As discussed earlier, the procedure of FIG. 8 determines, first of all, the number of half cycles which are present in the wave form 82 during the measurement interval. It is to be understood that integral half cycles are counted, not fractional half cycles. Second, the number of samples which are taken during the occurrence of these integral numbers of half cycle is determined. Thus, in step 120 of FIG. 9 the time interval which corresponds to the quantity present in the sample accumulator is determined. This time interval, Y, is deemed to correspond to the number of samples present in the sample accumulator multiplied by the sample interval. The units of this quantity are units of time. In step 122, the quantity present in the half cycle counter, e.g., X, is divided by the quantity Y and multiplied by one half. The result is the frequency of the incoming wave form 82.

Referring to FIG. 10, the update display step 118 will now be described in greater detail. As discussed earlier, the update method of the present invention permits the quantity displayed to respond quickly to large changes in the measured quantity, and to respond more slowly to small changes in the measured quantity. In step 123, the latest result is pushed onto a four level stack which contains the last four measurement results. In step 124, the current result is compared with the quantity which had been previously displayed. If the previously displayed quantity and the current result do not differ by more than the designated amount, as determined in step 126, then the current result is averaged with the last three results in step 132. This average is then displayed in step 134.

If, on the other hand, the determination in step 126 was that the previously displayed quantity and the current result differ by more than the designated amount, step 128 is entered. In this step, all four stack values are set equal to the latest result such that the averaged output from step 132 will equal the current result. This average is then displayed in step 134.

The terms and expressions which have been used herein are terms of description and not of limitation, and there is no intention in the use of such terms and expressions of excluding equivalents of the features shown and described, or portions thereof, it being recognized that various modifications are possible within the scope of the invention claimed.

We claim:

1. An apparatus for providing digital processing for analog signals having wide frequency and dynamic ranges, comprising
   an analog section for receiving analog signals from a test subject and for converting said analog signals into digital form, and for receiving digital representations of analog signals to be synthesized and for converting said digital representations into analog form, wherein said analog section provides said converted analog signals to the test subject;
   a digital section for receiving the digital representations of the analog signal from the test subject, for processing said digital representations, for providing digital representations of signals to be synthesized, and for providing control signals;
   means for optically coupling the digital representations and control signals between the analog and digital sections; and
   power supply means floating with respect to the digital section for providing power to the analog section.

2. The apparatus of claim 1 wherein the analog section includes a transformer like output stage for providing the synthesized analog signal to the test subject, comprising
   a plurality of current sources; and
   means for driving the current sources such that selected ones of the current sources operate as a current source/current sink pair with respect to the test subject.

3. The apparatus of claim 1 wherein the analog section includes a receiver section having a balanced input circuit and an analog to digital converter which converts the output of the balanced input circuit into digital form, wherein said balanced input circuit presents a transformer-like load to the test subject.

4. The apparatus of claim 1 wherein the optical coupling means include high speed optical couplers for coupling the digital representations between the digital and analog sections, and low speed optical couplers for coupling the control signals between the digital and analog sections.

5. The apparatus of claim 4, wherein the control signals for the analog to digital converter are coupled from the digital section to the analog section by way of high speed optical couplers.

6. The apparatus of claim 4 wherein the analog to digital converter samples at a first predetermined rate and the floating power supply operates at a second predetermined rate which is synchronized with the first predetermined rate so that the samples taken by the analog to digital converter occur at predetermined points relative to the second predetermined rate.

7. The apparatus of claim 1 wherein the analog section receives the analog signals from the test subject by way of a balanced input port and provides the converted analog signals to the test subject by way of a balanced output port, wherein the balanced input port presents a transformer-like load to the test subject.

8. The apparatus of claim 1 wherein the analog section includes a transformer like input stage for receiving the analog signed from the test subject.

9. A method for measuring the frequency of a periodic waveform comprising the steps of:
   detecting the number of complete half cycles present in the waveform over a measurement interval whose duration is predetermined without regard to the frequency of the waveform;
   determining the total elapsed time corresponding to said number of complete half cycles by subtracting away the times for those fractional half-cycles that may occur at the beginning and end of each measurement interval; and
   determining the frequency in accordance with the equation $$F = \tfrac{1}{2}(X/Y),$$

wherein F=frequency, X=said number of complete half-cycles, and Y=said total elapsed time.

10. The method of claim 9 wherein the detecting step includes the steps of:
    sampling the waveform at a rate greater than the frequency of the waveform;
    examining consecutive ones of the samples for a change in polarity of the samples to detect a first polarity change;
    recording the occurrence of a half cycle upon the occurrence of a second polarity change; and
    repeating the sampling, examining and recording steps until the measurement interval has elapsed.

11. The method of claim 10 wherein the recording step includes the step of validating the occurence of a half cycle by verifying that a predetermined threshold has been exceeded by the samples occurring between the first polarity change and the second polarity change associated with the half cycle.

12. The method of claim 10 wherein the total elapsed time determining step includes the steps of counting the number of samples which occur during a half cycle to provide a sample count;

accumulating the sample count for each of the half cycles detected in the waveform to provide and accumulated sample count; and multiplying the accumulated sample count by the sample interval to determine the total elapsed time.

13. The method of claim 12 wherein the accumulating step includes the step of validating the occurence of a half cycle before accumulating the sample count by verifying that a predetermined threshold has been exceeded by the samples occuring during the half cycle.

14. The apparatus of claim 6 wherein the second predetermined rate is a high frequency such that the capacitive coupling through the floating power supply can be made small.

15. The apparatus of claim 14 wherein the second predetermined rate is approximately 1 MHz.

16. The apparatus of claim 14 wherein the second predetermined rate is substantially greater than 60 Hz.

* * * * *